US012451468B1

(12) United States Patent
Neufeld et al.

(10) Patent No.: US 12,451,468 B1
(45) Date of Patent: Oct. 21, 2025

(54) III-N DEVICES WITH IMPROVED RELIABILITY

(71) Applicant: Transphorm Technology, Inc., Goleta, CA (US)

(72) Inventors: Carl Joseph Neufeld, Goleta, CA (US); David Michael Rhodes, Santa Barbara, CA (US); Likun Shen, Goleta, CA (US); Ronald Avrom Barr, Santa Barbara, CA (US)

(73) Assignee: Transphorm Technology, Inc., Goleta, CA (US)

( * ) Notice: Subject to any disclaimer, the term of this patent is extended or adjusted under 35 U.S.C. 154(b) by 558 days.

(21) Appl. No.: 17/894,080

(22) Filed: Aug. 23, 2022

Related U.S. Application Data

(60) Provisional application No. 63/237,015, filed on Aug. 25, 2021.

(51) Int. Cl.
*H01L 25/07* (2006.01)
*H01L 23/00* (2006.01)
(Continued)

(52) U.S. Cl.
CPC ...... *H01L 25/072* (2013.01); *H01L 23/49844* (2013.01); *H01L 24/46* (2013.01);
(Continued)

(58) Field of Classification Search
CPC ....... H01L 25/072; H01L 24/46; H01L 24/49; H01L 23/49844; H01L 2224/46;
(Continued)

(56) References Cited

U.S. PATENT DOCUMENTS 7,795,642 B2   9/2010   Suh et al.
7,851,825 B2   12/2010   Suh et al.
(Continued)

OTHER PUBLICATIONS

Barr et al., "High Voltage GaN Switch Reliability," WIPDA Conference, Atlanta, GA, Nov. 2018, 7 pages.
(Continued)

*Primary Examiner* — Joseph C. Nicely
(74) *Attorney, Agent, or Firm* — Fish & Richardson P.C.

(57) ABSTRACT

An electronic component includes at least three terminals extending from a component package. The component includes a depletion-mode III-N transistor, and an enhancement-mode transistor in the package. A gate electrode of the enhancement-mode transistor is electrically connected to the first terminal, a source electrode of the enhancement-mode transistor and a gate electrode of the depletion-mode III-N transistor are electrically connected to the second terminal, a drain electrode of the enhancement-mode transistor is electrically connected to a source electrode of the depletion-mode III-N transistor, and a drain electrode of the depletion-mode III-N transistor is electrically connected to the third terminal. The drain electrode includes multiple drain pads each sequentially a further distance from the third terminal, where a wire-bond extends from each drain pad to the third terminal, each wire-bond having a length, where a diameter of the longest wire-bond is greater than the diameter of the shortest wire-bond.

9 Claims, 11 Drawing Sheets

(51) Int. Cl.
*H01L 23/498* (2006.01)
*H10D 30/47* (2025.01)

(52) U.S. Cl.
CPC ............. *H01L 24/49* (2013.01); *H10D 30/47* (2025.01); *H10D 30/471* (2025.01); *H01L 2224/46* (2013.01); *H01L 2224/48135* (2013.01); *H01L 2224/48157* (2013.01); *H01L 2224/4903* (2013.01); *H01L 2224/49111* (2013.01); *H01L 2224/49112* (2013.01); *H01L 2224/4912* (2013.01)

(58) Field of Classification Search
CPC ... H01L 2224/4903; H01L 2224/48135; H01L 2224/48157; H01L 2224/49111; H01L 2224/49112; H01L 2224/4912; H10D 30/47; H10D 30/471
See application file for complete search history.

(56) References Cited

U.S. PATENT DOCUMENTS

| | | | |
|---|---|---|---|
| 7,875,907 B2 | 1/2011 | Honea et al. | |
| 7,884,394 B2 * | 2/2011 | Wu | H01L 23/492 |
| | | | 257/E29.246 |
| 7,898,004 B2 | 3/2011 | Wu et al. | |
| 7,915,643 B2 | 3/2011 | Suh et al. | |
| 7,939,391 B2 | 5/2011 | Suh et al. | |
| 7,965,126 B2 | 6/2011 | Honea et al. | |
| 8,138,529 B2 | 3/2012 | Wu | |
| 8,193,562 B2 | 6/2012 | Suh et al. | |
| 8,237,198 B2 | 8/2012 | Wu et al. | |
| 8,289,065 B2 | 10/2012 | Honea et al. | |
| 8,344,424 B2 | 1/2013 | Suh et al. | |
| 8,389,977 B2 | 3/2013 | Chu et al. | |
| 8,390,000 B2 | 3/2013 | Chu et al. | |
| 8,431,965 B2 | 4/2013 | Takemae | |
| 8,455,931 B2 | 6/2013 | Wu | |
| 8,493,129 B2 | 7/2013 | Honea et al. | |
| 8,508,281 B2 | 8/2013 | Honea et al. | |
| 8,519,438 B2 | 8/2013 | Mishra et al. | |
| 8,530,996 B2 | 9/2013 | Shono | |
| 8,531,232 B2 | 9/2013 | Honea et al. | |
| 8,536,622 B2 | 9/2013 | Takemae et al. | |
| 8,541,815 B2 | 9/2013 | Takemae et al. | |
| 8,541,818 B2 | 9/2013 | Wu et al. | |
| 8,569,124 B2 | 10/2013 | Akiyama et al. | |
| 8,581,300 B2 | 11/2013 | Yamada | |
| 8,592,974 B2 | 11/2013 | Wu | |
| 8,598,937 B2 | 12/2013 | Lal et al. | |
| 8,603,880 B2 | 12/2013 | Yamada | |
| 8,624,662 B2 | 1/2014 | Parikh et al. | |
| 8,633,517 B2 | 1/2014 | Kamada | |
| 8,633,518 B2 | 1/2014 | Suh et al. | |
| 8,643,062 B2 | 2/2014 | Parikh et al. | |
| 8,648,643 B2 | 2/2014 | Wu | |
| 8,664,927 B2 | 3/2014 | Shono | |
| 8,675,326 B2 | 3/2014 | Shono | |
| 8,692,294 B2 | 4/2014 | Chu et al. | |
| 8,716,141 B2 | 5/2014 | Dora et al. | |
| 8,742,459 B2 | 6/2014 | Mishra et al. | |
| 8,742,460 B2 | 6/2014 | Mishra et al. | |
| 8,766,711 B2 | 7/2014 | Takemae | |
| 8,772,842 B2 | 7/2014 | Dora | |
| 8,773,176 B2 | 7/2014 | Miyazaki et al. | |
| 8,786,327 B2 | 7/2014 | Honea et al. | |
| 8,803,246 B2 | 8/2014 | Wu et al. | |
| 8,816,497 B2 | 8/2014 | Wu | |
| 8,816,751 B2 | 8/2014 | Honea et al. | |
| 8,836,301 B2 | 9/2014 | Shono | |
| 8,836,308 B2 | 9/2014 | Shono | |
| 8,836,380 B2 | 9/2014 | Takemae | |
| 8,841,702 B2 | 9/2014 | Mishra et al. | |
| 8,847,283 B2 | 9/2014 | Kamada et al. | |
| 8,860,495 B2 | 10/2014 | Lal et al. | |
| 8,878,248 B2 | 11/2014 | Ishiguro et al. | |
| 8,878,571 B2 | 11/2014 | Takemae | |
| 8,883,581 B2 | 11/2014 | Ohki | |
| 8,890,206 B2 | 11/2014 | Yamada | |
| 8,890,314 B2 | 11/2014 | Wu | |
| 8,895,421 B2 | 11/2014 | Parikh et al. | |
| 8,895,423 B2 | 11/2014 | Dora | |
| 8,901,604 B2 | 12/2014 | Mishra et al. | |
| 8,912,839 B2 | 12/2014 | Honea et al. | |
| 8,933,489 B2 | 1/2015 | Kikkawa | |
| 8,952,750 B2 | 2/2015 | Wu | |
| 8,957,453 B2 | 2/2015 | Yamada et al. | |
| 8,962,409 B2 | 2/2015 | Tomabechi | |
| 9,006,787 B2 | 4/2015 | Yamada | |
| 9,035,356 B2 | 5/2015 | Yamada | |
| 9,041,435 B2 | 5/2015 | Honea et al. | |
| 9,041,465 B2 | 5/2015 | Bouisse | |
| 9,059,076 B2 | 6/2015 | Wu et al. | |
| 9,059,136 B2 | 6/2015 | Kamada et al. | |
| 9,087,718 B2 | 7/2015 | Lal | |
| 9,093,366 B2 | 7/2015 | Mishra et al. | |
| 9,099,351 B2 | 8/2015 | Nishimori et al. | |
| 9,099,545 B2 | 8/2015 | Akiyama et al. | |
| 9,111,961 B2 | 8/2015 | Chu et al. | |
| 9,136,107 B2 | 9/2015 | Katani et al. | |
| 9,142,638 B2 | 9/2015 | Yamada | |
| 9,142,658 B2 | 9/2015 | Kikkawa et al. | |
| 9,147,760 B2 | 9/2015 | Mishra et al. | |
| 9,165,766 B2 | 10/2015 | Keller et al. | |
| 9,171,730 B2 | 10/2015 | Chowdhury et al. | |
| 9,171,836 B2 | 10/2015 | Lal et al. | |
| 9,171,910 B2 | 10/2015 | Wu et al. | |
| 9,184,275 B2 | 11/2015 | Mishra et al. | |
| 9,190,295 B2 | 11/2015 | Wu | |
| 9,196,716 B2 | 11/2015 | Mishra et al. | |
| 9,209,176 B2 | 12/2015 | Wu et al. | |
| 9,224,671 B2 | 12/2015 | Parikh et al. | |
| 9,224,721 B2 | 12/2015 | Wu | |
| 9,224,805 B2 | 12/2015 | Mishra et al. | |
| 9,231,075 B2 | 1/2016 | Yamada | |
| 9,244,848 B2 | 1/2016 | Boyd et al. | |
| 9,245,992 B2 | 1/2016 | Keller et al. | |
| 9,245,993 B2 | 1/2016 | Keller et al. | |
| 9,257,547 B2 | 2/2016 | Fichtenbaum et al. | |
| 9,293,458 B2 | 3/2016 | Parikh et al. | |
| 9,293,561 B2 | 3/2016 | Mishra et al. | |
| 9,299,822 B2 | 3/2016 | Kikkawa | |
| 9,318,593 B2 | 4/2016 | Wu et al. | |
| 9,343,560 B2 | 5/2016 | Suh et al. | |
| 9,349,805 B2 | 5/2016 | Ito et al. | |
| 9,362,903 B2 | 6/2016 | Wu et al. | |
| 9,373,699 B2 | 6/2016 | Chu et al. | |
| 9,401,341 B2 | 7/2016 | Wu | |
| 9,425,268 B2 | 8/2016 | Minoura et al. | |
| 9,437,707 B2 | 9/2016 | Mishra et al. | |
| 9,437,708 B2 | 9/2016 | Mishra et al. | |
| 9,443,849 B2 | 9/2016 | Wu et al. | |
| 9,443,938 B2 | 9/2016 | Mishra et al. | |
| 9,490,324 B2 | 11/2016 | Mishra et al. | |
| 9,496,137 B2 | 11/2016 | Chu et al. | |
| 9,520,491 B2 | 12/2016 | Chowdhury et al. | |
| 9,536,966 B2 | 1/2017 | Ogino | |
| 9,536,967 B2 | 1/2017 | Kikkawa et al. | |
| 9,537,425 B2 | 1/2017 | Honea | |
| 9,543,940 B2 | 1/2017 | Wang et al. | |
| 9,590,060 B2 | 3/2017 | Lal | |
| 9,590,494 B1 | 3/2017 | Zhou et al. | |
| 9,620,616 B2 | 4/2017 | Yamada et al. | |
| 9,634,100 B2 | 4/2017 | Mishra et al. | |
| 9,640,648 B2 | 5/2017 | Kikkawa | |
| 9,660,640 B2 | 5/2017 | Wang et al. | |
| 9,685,323 B2 | 6/2017 | Keller et al. | |
| 9,685,338 B2 | 6/2017 | Minoura et al. | |
| 9,690,314 B2 | 6/2017 | Honea et al. | |
| 9,741,702 B2 | 8/2017 | Wu | |
| 9,818,686 B2 | 11/2017 | Wu et al. | |
| 9,818,840 B2 | 11/2017 | Kikkawa | |
| 9,831,315 B2 | 11/2017 | Chu et al. | |
| 9,842,922 B2 | 12/2017 | Mishra et al. | |

(56) References Cited

U.S. PATENT DOCUMENTS

| | | | |
|---|---|---|---|
| 9,865,719 B2 | 1/2018 | Keller et al. | |
| 9,899,998 B2 | 2/2018 | Honea et al. | |
| 9,935,190 B2 | 4/2018 | Wu et al. | |
| 9,941,399 B2 | 4/2018 | Mishra et al. | |
| 9,991,884 B2 | 6/2018 | Wang et al. | |
| 10,043,896 B2 | 8/2018 | Mishra et al. | |
| 10,043,898 B2 | 8/2018 | Lal | |
| 10,063,138 B1 | 8/2018 | Zhou et al. | |
| 10,630,285 B1 | 4/2020 | Cuadra et al. | |
| 11,810,971 B2 | 11/2023 | Wu et al. | |
| 2008/0099783 A1* | 5/2008 | Fukamizu | H01L 23/585 257/784 |
| 2008/0128755 A1* | 6/2008 | Fukamizu | H01L 24/49 257/E21.627 |
| 2008/0128826 A1* | 6/2008 | Fukamizu | H01L 24/49 257/379 |
| 2008/0203577 A1* | 8/2008 | Fukamizu | H01L 24/06 257/E21.507 |
| 2014/0091314 A1* | 4/2014 | Ishiguro | H10D 62/8164 257/76 |
| 2014/0306238 A1* | 10/2014 | Taniguchi | H01L 23/49575 257/76 |
| 2017/0077012 A1* | 3/2017 | Kosaka | H01L 23/66 |
| 2022/0102253 A1* | 3/2022 | Beer | H01L 24/29 |
| 2023/0335464 A1 | 10/2023 | Gupta et al. | |

OTHER PUBLICATIONS

Chu et al., "1200-V Normally Off GaN-on-Si Field-effect Transistors with Low Dynamic On-Resistance," IEEE Electron Device Letters, 2011, 32(5):632-634.

Coffie et al., "Unpassivated p-GaN/AlGaN/GaN HEMTs with 7.1 W/mm at 10 GhZ," Electronic Letters, 2003, 39(19):1419-1420.

Coffie, "Characterizing and Suppressing DC-to-RF Dispersion in AlGaN/GaN High Electron Mobility Transistors," 2003, PhD Thesis, University of California, Santa Barbara, 169 pages.

Dora et al., "High Breakdown Voltage Achieved on AlGaN/GaN HEMTs with Integrated Slant Field Plates," IEEE Electron Device Letters, 2006, 27(9):713-715.

Dora et al., "ZrO2 Gate Dielectrics Produced by Ultraviolet Ozone Oxidation for GaN and AlGaN/GaN Transistors," J. Vac. Sci. Technol. B, 2006, 24(2)575-581.

Dora, "Understanding Material and Process Limits for High Breakdown Voltage AlGaN/GaN HEMTs," PhD Thesis, University of California, Santa Barbara, Mar. 2006, 157 pages.

Huang et al., "Preventing GaN Device VHF Oscillation," APEC 2017 Industry Session, Mar. 2017, 25 pages.

Keller et al., "GaN—GaN Junctions with Ultrathin AlN Interlayers: Expanding Heterojunction Design," Applied Physics Letters, 2002, 80(23):4387-4389.

Mishra et al., "AlGaN/GaN HEMTs—An Overview of Device Operation and Applications," Proceedings of the IEEE, 2002, 90(6):1022-1031.

Parikh et al., "650 Volt GaN Commercialization Reaches Automotive Standards," ECS Transactions, 2017, 80(7):17-28.

Parikh et al., "Commercialization of High 600V GaN-on-Silicon Power HEMTs and Diodes," 2013 IEEE, 5 pages.

Parikh, "Driving the Adoption of High-voltage Gallium Nitride Filed-effect Transistors," IEEE Power Electronics Magazine, Sep. 2017, 3 pages.

Shen, "Advanced Polarization-based Design of AlGaN/GaN HEMTs," Jun. 2004, PhD Thesis, University of California, Santa Barbara, 192 pages.

Smith et al., "Reliability Lifecycle of GaN Power Devices," Transphorm Inc., Mar. 2017, 8 pages.

Suh et al. "High-Breakdown Enhancement-mode AlGaN/GaN HEMTs with Integrated Slant Field-Plate," Electron Devices Meeting, 2006, IEDM '06 International, 3 pages.

Wang et al., "Investigation of Driver Circuits for GaN HEMTs in Leaded Packages," Workshop on Wide Bandgap Power Devices and Applications (WiPDA), 2014 IEEE, pp. 81-87.

Wang et al., "Paralleling GaN HEMTs for Diode-free Bridge Power Converters," 2015 IEEE Applied Power Electronics Conference and Exposition (APEC), Charlotte, NC, 2015, pp. 752-758.

Wang, et al., "Design and Implementation of a High-efficiency Three-level Inverter Using GaN HEMTs," PCIM Europe 2015, May 19-21, 2015, Nuremberg, Germany, 7 pages.

Wu et al., "A 97.8% Efficient GaN HEMT Boost Converter with 300-W Output Power at 1 MHz," Electronic Device Letters, 2008, IEEE, 29(8):824-826.

Wu et al., "Advances in Reliability and Operation Space of High-voltage GaN Power Devices on Si Substrates," (2014) IEEE, 3 pages.

Wu et al., "High-frequency, GaN Diode-free Motor Drive Inverter with Pure Sine Wave Output," PCIM Europe 2012, Conference Digest, pp. 40-43.

Wu et al., "kV-Class GaN-on-Si HEMTs Enabling 99% Efficiency Converter at 800 V and 100 kHz," IEEE Transactions on Power Electronics. 2014 29(6):2634-2637.

Wu et al., "Total GaN Solution to Electrical Power Conversion," the 69th IEEE Device Research Conference, Conference Digest, Jun. 20-22, 2011, pp. 217-218.

Wu, "AlGaN/GaN Microwave Power High-Mobility Transistors," PhD Thesis, University of California, Santa Barbara, Jul. 1997, 134 pages.

Wu, "Paralleling High-speed GaN Power HEMTs for Quadrupled Power Output," Applied Power Electronics Conference and Exposition (APEC), 2013, pp. 211-214.

Xu et al., "Investigation of 600 V GaN HEMTs for High Efficiency and High Temperature Applications," Applied Power Electronics Conference and Exposition (APEC), Apr. 2014, pp. 131-136.

Zhang et al., "Common-mode Circulating Current Control of Paralleled Interleaved Three Phase Two-level Voltage-source Converters with Discontinuous Space-vector Modulation," IEEE Transactions on Power Electronics, Dec. 2011, 26(12):3925-3935.

Zhang et al., "Evaluation of 600 V Cascode GaN HEMT in Device Characterization and All-GaN-based LLC Resonant Converter," In Proc. Energy Conversion Congress and Exposition (ECCE), Sep. 2013 IEEE, pp. 3571-3578.

Zhang et al., "Gate Drive Design Considerations for High Voltage Cascode GaN HEMT," Applied Power Electronics Conference and Exposition (APEC), Mar. 2014, pp. 1484 1489.

Zhang et al., "Impact of Interleaving on AC Passive Components of Paralleled Three phase Voltage-source Converters," IEEE Transactions on Industry Applications, May/Jun. 2010, 46(3):1042-1054.

Zhang, "High Voltage GaN HEMTs with Low On-resistance for Switching Applications," PhD Thesis, University of California, Santa Barbara, Sep. 2002, 166 pages.

Zhou et al., "99% Efficiency True-bridgeless Totem-pole PFC Based on GaN HEMTs," PCIM Europe May 14-16, 2013, pp. 1017-1022.

Zhou et al., "High-efficiency True Bridgeless Totem Pole PFC Based on GaN HEMTs: Design Challenges and Cost-effective Solution," PCIM Europe 2015, pp. 1482-1489.

Zuk et al., "How to Design with GaN in 1 Hour!," APEC 2017 Exhibitor Session, Mar. 2017, 24 pages.

\* cited by examiner

III-N DEVICES WITH IMPROVED RELIABILITY

CROSS-REFERENCE TO RELATED APPLICATION

This application claims priority to U.S. Provisional Application No. 63/237,015, filed on Aug. 25, 2021, the content of which is incorporated by reference.

TECHNICAL FIELD

The disclosed technologies relate to semiconductor devices, in particular III-Nitride transistors and switches.

BACKGROUND

Currently, typical power semiconductor devices, including devices such as transistors, diodes, power MOSFETs, are fabricated with silicon (Si) semiconductor material. More recently, wide-bandgap materials (SiC, III-N) have been considered for power devices due to their superior properties. III-Nitride or III-N semiconductor devices, such as gallium nitride (GaN) high-electron-mobility transistor (HEMT) devices, are now emerging as attractive candidates to carry large currents, support high voltages and provide very low on-resistance and fast switching times.

GaN HEMT devices are beginning to be commercialized in low voltages (e.g., 5V-200V) or with a relatively high on-resistances (e.g., 100-500 mohm). However, reliable fabrication of larger GaN HEMT devices designed for high-voltages (e.g., greater than 600V) in combination with low on-resistances (e.g., less than 50 mohm) has thus far proven to be difficult.

SUMMARY

Described herein are III-N (e.g., GaN) HEMT devices and corresponding electronic component packages having increased reliability and robustness.

In a first aspect, an electronic component is described. The electronic component comprising a first terminal, a second terminal, and a third terminal extending from a component package. The component further comprising a depletion-mode III-N transistor, and an enhancement-mode transistor arranged in the package. A first gate electrode of the enhancement-mode transistor is electrically connected to the first terminal, a first source electrode of the enhancement-mode transistor and a second gate electrode of the depletion-mode III-N transistor are electrically connected to the second terminal, a first drain electrode of the enhancement-mode transistor is electrically connected to a second source electrode of the depletion-mode III-N transistor, and a second drain electrode of the depletion-mode III-N transistor is electrically connected to the third terminal. The second drain electrode includes multiple drain pads each sequentially a further distance from the third terminal, where a wire-bond extends from each drain pad to the third terminal, each wire-bond having a length, where a diameter of the longest wire-bond is greater than the diameter of the shortest wire-bond.

In a second aspect, an electronic component is described. The electronic component comprising at least a first terminal extending from a component package, and a III-N transistor arranged in the package, where a drain electrode of the III-N transistor is electrically connected to the first terminal. The drain electrode includes multiple drain pads each sequentially a further distance from the first terminal, where a wire-bond extends from each drain pad to the first terminal. Each wire-bond having a length and a diameter, where the diameter of the longest wire-bond is greater than the diameter of the shortest wire-bond.

In a third aspect, an electronic package is described. The electronic packaged includes a structural package base, as III-N transistor, and a molding compound. A conductive substrate of the III-N transistor is physically mounted and electrically connected to the structural package base, and the molding compound is formed over the III-N transistor and the structural package base, and an elastomer layer is fully formed between the III-N transistor and the molding compound.

In a fourth aspect an electronic device is described. The electronic device comprising a III-N material structure formed over a substrate and a two-dimensional electron gas (2DEG) is formed within the III-N material structure. An initial metal layer having a thickness of less than 0.5 um is electrically connected to the 2DEG, and a first metal layer over and electrically connected to the initial metal layer having a thickness greater than 1.0 um, a second metal layer over and electrically connected to the first metal layer having a thickness greater than 2.0 um, and a third metal layer over and electrically connected to the second metal layer having a thickness greater than 2.0 um. A first and second dielectric layer is formed between the III-N material structure and the second metal layer, each comprising a compressive stress. A third dielectric layer, a fourth dielectric layer and a fifth dielectric layer is formed between the second metal layer and the third metal layer, each comprising a compressive stress, where the compressive stress of the second dielectric layer is less than the compressive stress of the first dielectric layer, and the compressive stress of the fourth dielectric layer is less than the compressive stress of the third dielectric layer and the fifth dielectric layer.

Each of the electronic components, packages, devices, and/or transistors described herein can include one or more of the following features. The diameter of the longest wire-bond is 10 mil or greater, and the diameter of the shortest wire-bond is less than 10 mil. The diameter of each wire bond increases monotonically from the shortest length to the longest length. A substrate of the depletion-mode III-N transistor is electrically connected to a second gate electrode of the III-N transistor, and the substrate is electrically connected to the conductive structural package base. The conductive structural package base is electrically connected to the second terminal. The elastomer is a thermoset silicon get elastomer. The elastomer is a stress buffer layer between the III-N transistor and the molding compound. The minimum thickness of the elastomer layer between the III-N transistor and the molding compound is greater than 100 um. The wire-bonds partially extend through the elastomer layer to electrically connect to the drain electrode. The thickness of the fourth dielectric layer is greater than the thickness of the third dielectric layer and the thickness of the fifth dielectric layer. The third dielectric is a SiN layer the fourth dielectric layer is a SiON layer, and the fifth dielectric layer is a SiON layer with a higher compressive stress than the fourth dielectric layer. The third dielectric layer is a SiN layer, the fourth dielectric layer is a TOES Oxide layer, and the fifth layer is a TEOS Oxide layer with a higher compressive stress than the fourth dielectric layer. The third dielectric layer is a SiN layer, the fourth dielectric layer is a SiON layer, and the fifth dielectric layer is a SiN layer. The thickness of the third dielectric layer is less than 3 um, the thickness of the fourth dielectric layer is greater that 3 um and the thickness of the fifth dielectric layer is less than 3 um. The thickness of the fifth dielectric layer is less than or equal to 0.5 um. The compressive stress of the fifth dielectric layer is at least 10 times greater than the compressive stress of the fourth dielectric layer. The compressive stress of the third dielectric layer is at least 2 times greater than the compressive stress of the fourth dielectric layer. The first dielectric layer is a SiN layer, and the second dielectric layer is a SiON layer. The device can include a sixth dielectric layer between the second dielectric layer and the third dielectric layer, wherein the sixth dielectric layer is a SiON layer with a compressive stress that is at least 2 times greater than the compressive stress of the second dielectric layer.

As used herein, the terms III-Nitride or III-N materials, layers, devices, etc., refer to a material or device comprised of a compound semiconductor material according to the stoichiometric formula $B_w Al_x In_y Ga_z N$, where w+x+y+z is about 1 with $0 \le w \le 1$, $0 \le x \le 1$, $0 \le y \le 1$, and $0 \le z \le 1$. III-N materials, layers, or devices, can be formed or prepared by either directly growing on a suitable substrate (e.g., by metal organic chemical vapor deposition), or growing on a suitable substrate, detaching from the original substrate, and bonding to other substrates. The term device will be used in general for any transistor or switch or diode when there is no need to distinguish between them.

As used herein, two or more contacts or other items such as conductive channels or components are said to be "electrically connected" if they are connected by a material which is sufficiently conducting to ensure that the electric potential at each of the contacts or other items is intended to be the same, e.g., is about the same, at all times under any bias conditions.

As used herein, "blocking a voltage" refers to the ability of a transistor, device, or component to prevent significant current, such as current that is greater than 0.001 times the operating current during regular conduction, from flowing through the transistor, device, or component when a voltage is applied across the transistor, device, or component. In other words, while a transistor, device, or component is blocking a voltage that is applied across it, the total current passing through the transistor, device, or component will not be greater than 0.001 times the operating current during regular conduction. Devices with off-state currents which are larger than this value exhibit high loss and low efficiency, and are typically not suitable for many applications, especially power switching applications.

As used herein, a "high-voltage device", e.g., a high-voltage switching transistor, HEMT, bidirectional switch, or four-quadrant switch (FQS), is an electronic device which is optimized for high-voltage applications. That is, when the device is off, it is capable of blocking high voltages, such as about 300V or higher, about 600V or higher, or about 1200V or higher, and when the device is on, it has a sufficiently low on-resistance ($R_{ON}$) for the application in which it is used, e.g., it experiences sufficiently low conduction loss when a substantial current passes through the device. A high-voltage device can at least be capable of blocking a voltage equal to the high-voltage supply or the maximum voltage in the circuit for which it is used. A high-voltage device may be capable of blocking 300V, 600V, 1200V, 1700V, 2500V, 3300V or other suitable blocking voltage required by the application. In other words, a high-voltage device can block all voltages between 0V and at least $V_{max}$, where $V_{max}$ is the maximum voltage that can be supplied by the circuit or power supply, and $V_{max}$ can for example be 300V, 600V, 1200V, 1700V, 2500V, 3300V or other suitable blocking voltage required by the application. For a bidirectional or four quadrant switch, the blocked voltage could be of any polarity less a certain maximum when the switch is OFF ($\pm V_{max}$ such as $\pm 300V$ or $\pm 600V$, $\pm 1200V$ and so on), and the current can be in either direction when the switch is ON.

As used herein, an electrode refers to the metal layers within a device or transistor which are connected to either the source, gate or drain of the device. A "pad" such as a "source pad, drain pad, or gate pad" refer to the uppermost un-passivated portion of the electrode which is used to electrically connect the device or transistor to the package e.g., with solder, epoxy, wire-bonds and/or metal clips.

The terms "over," "under," "between," and "on" as used herein refer to a relative position of one layer with respect to other layers. As such, for example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in contact with that second layer. Additionally, the relative position of one layer with respect to other layers is provided assuming operations are performed relative to a substrate without consideration of the absolute orientation of the substrate.

The details of one or more disclosed implementations of the subject matter described in this specification are set forth in the accompanying drawings and the description below. Additional features and variations may be included in the implementations as well. Other features, aspects, and advantages will become apparent from the description, the drawings and the claims.

DETAILED DESCRIPTION

Reliable fabrication of larger GaN HEMT devices designed for high-voltages in combination with low on-resistances has thus far proven to be difficult. However, design and packaging improvements can be used to increase the reliability and robustness of these III-N devices. A variety of design and packaging improvements are described below, and these can be used independently or in combination. In particular, described herein are III-N devices, for example GaN/AlGaN HEMT transistors, that have an increased reliability and robustness. The III-N devices can be assembled into an electronic component package. The III-N devices can be designed for operation at high voltages (e.g., greater than 600V) with low on-resistances (e.g., less than 50 mohms).

Figure 1:
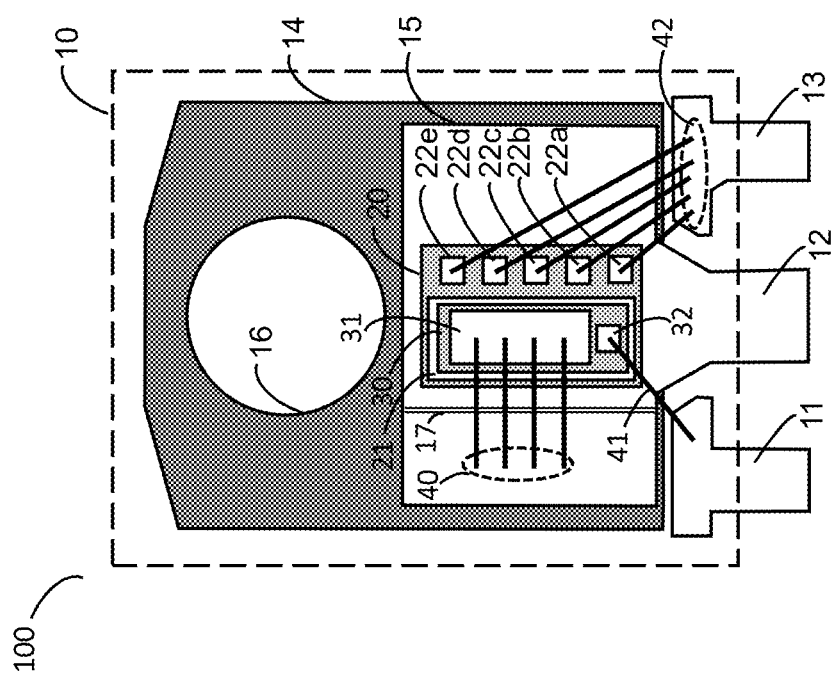
FIG. 1 is a plan view of an electronic component and package.

FIG. 1 shows a plan view of an electronic component 100. The electronic component includes a package 10. Electronic component 100 includes at least a first terminal 11, a second terminal 12 and a third terminal 13 which can extend outside the package 10 and can be used to electronically connect the electronic component to a printed circuit board (PCB) or other appropriate electronic system. Package 10 can be a TO type package (e.g., a TO-247 or TO-220) or a surface mount device or a leadless package (such as SMD, TOLL, or LFPAK) type package or any other appropriate semiconductor type package.

Electronic component 100 can include a molding compound 14 which is used to hermetically seal and encapsulate the III-N device and a screw-hole 16 to attach the electronic component 100 to a heatsink or PCB. The package includes a conductive structural lead-frame 15 which can be, for example copper, nickel, or a combination thereof, and which functions as a conductive structural base for the electronic component package 10. The lead-frame 15 is connected to the second terminal 12 and preferably manufactured out of the same piece of conductive material.

Component 100 includes a high-voltage III-N device 20 (e.g., a GaN HEMT transistor, bi-directional switch, or FQS) which can be designed to operate with very low on-resistance (e.g., less than 50 mohms, or less than 10 mohms) and operate at high current levels (e.g., greater than 50 A). Device 20 can be a high-voltage device, such that when the device is biased "OFF," it is capable of blocking a voltage greater than 300V, or greater than 600V, or greater than 1200V. The III-N device 20 can be an enhancement-mode device (i.e., normally-off device) or a depletion-mode device (i.e., normally-on device). In the case of a depletion-mode device, the electronic component 100 can also include a vertical low-voltage enhancement-mode device 30 (e.g., a SiFET transistor) in a cascode configuration to form a hybrid device, which can operate as a single normally-off III-N device.

As seen in FIG. 1, the gate pad 32 of the enhancement-mode device 30 is electrically connected to the first terminal 11 with a wire-bond 41. The source pad 31 of enhancement-mode device 30 is electrically connected to the lead-frame 15 with multiple wire-bonds (e.g., four wire-bonds as shown in FIG. 1) as indicated by the dashed area 40. The drain pad of the vertical enhancement-mode device 30 (not shown) is directly mounted and electrically connected to the source pad 21 of the III-N device 20. The III-N device 20 can include multiple drain pads 22a-22e which are electrically connected to the third terminal 13 as indicated by the dashed area 42. Wire-bonds 40-42 can be aluminum wire-bonds, copper wire-bonds, gold wire-bonds, copper-core aluminum wire-bonds or any other suitable material. Each drain pad 22a-22e is sequentially a further distance from the third terminal 13.

The III-N material structure layers (i.e., epi layers) of the HEMT device 20 can be formed on a conductive substrate (e.g., a highly doped semiconductor substrate such as silicon). A via-hole can be formed through the III-N material structure (not shown for simplicity) and the gate electrode of the depletion-mode device 20 can be electrically connected by a metal layer formed in the via-hole to the substrate. The conductive substrate of device 20 is electrically connected and directly physically attached to the lead-frame 15 with solder, epoxy or another appropriate material. Therefore, the source pad of the enhancement-mode transistor 30 and the gate electrode of the depletion-mode III-N device 20 (not shown) are electrically connected to the lead frame 15 and the second terminal 12. Hence, the first terminal 11 is a gate terminal, the second terminal 12 is a source terminal, and the third terminal 13 is a drain terminal of the electronic component 100. In the case of a TO type package (as shown in FIG. 1), a Gate-Source-Drain (G-S-D) configuration can be used, where the source terminal of the component 100 is connected to the center terminal of the package.

The lead-frame 15 can optionally include portion 17 which is a solder dam. Solder dam 17 can be a "V" shaped grove which is etched into lead-frame 15 in order to prevent the solder used to attached device 20 from reflowing beyond the grove 17 and affecting the wire-bond connections in dashed area 40.

Figure 2:
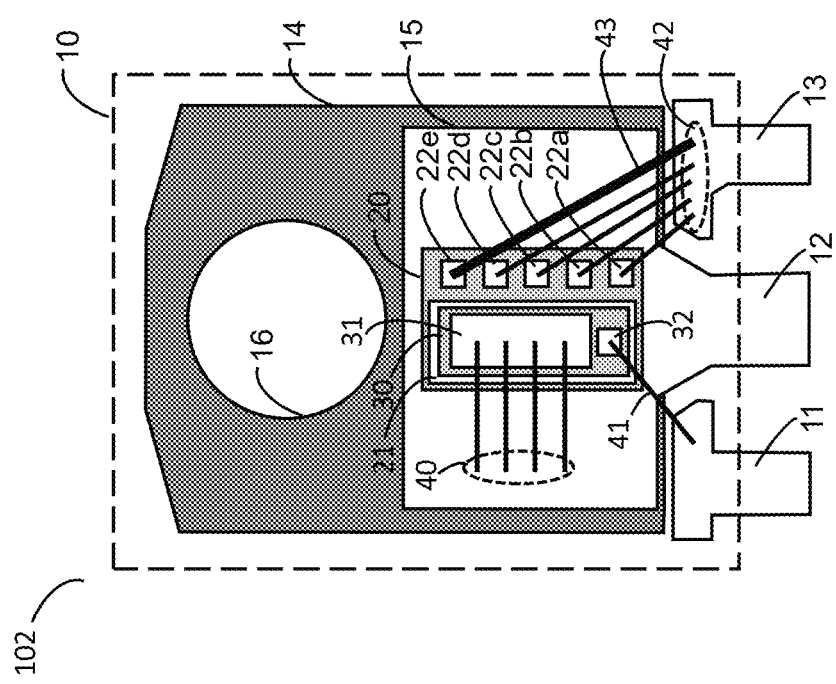
FIG. 2 is a plan view of an electronic component and package.

FIG. 2 is a plan view of an electronic component 102 which is similar to the electronic component 100 of FIG. 1. However, component 102 includes a drain connected wire-bond 43 which extends from drain pad 22e to the third terminal 13. The drain pad 22e is located at the farthest distance from the third terminal 13 compared to the other drain pads 22a-22d, and wire-bond 43 has a larger wire diameter compared to the other drain wire-bonds illustrated by dashed area 42 which connect to drain pads 22a-22d. Therefore, the longest drain wire-bond of component 102 has the largest diameter to improve device reliability and thermal cycling compared to electronic component 100. For example, the wire-bond 43 can have a diameter greater than or equal to 10 mil and the other drain wire-bonds can have a diameter less than 10 mil. The shortest drain wire-bond in dashed area 42 can have the smallest diameter and the longest wire-bond in dashed areas 42 can have the largest diameter. Furthermore, the diameter of the wire-bonds can increase monotonically from wire-bond to wire-bond as the length of the wire-bonds increases.

Figure 3A:
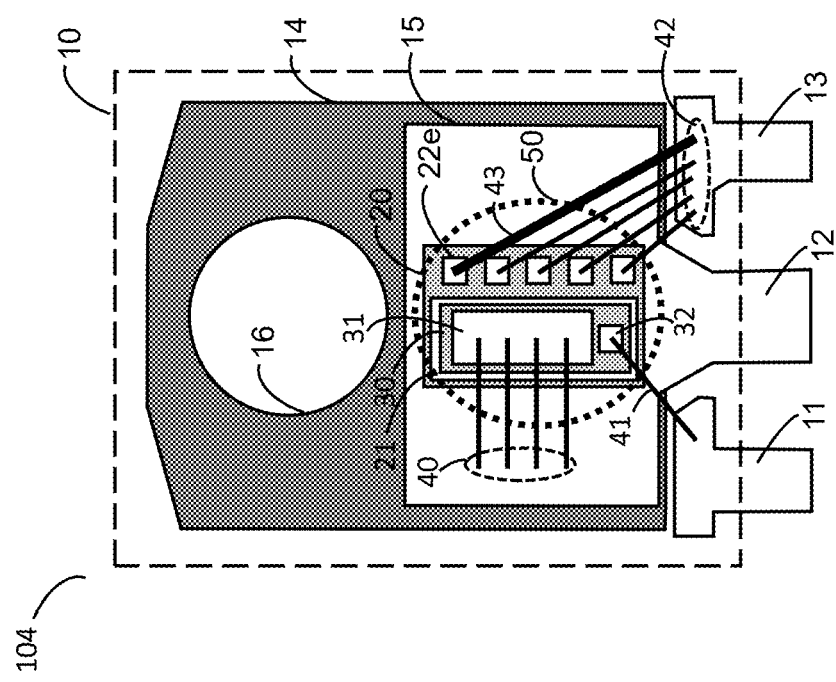
FIGS. 3A and 3B are a plan view and cross-sectional view, respectively, of an electronic component and package.
Figure 3B:
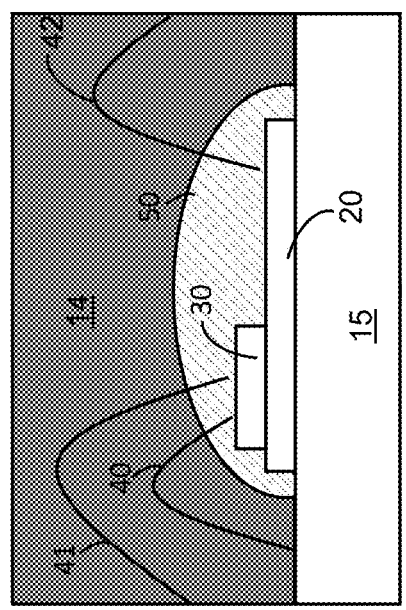

FIG. 3A and FIG. 3B are a plan view and cross-sectional view, respectively, of electronic component 104 which is similar to the electronic component 100 of FIG. 1. However, electronic component 104 includes a thermoset silicone gel elastomer layer 50 (indicated by dashed lines in FIG. 3A and best seen in FIG. 3B). As shown in FIG. 3B, the elastomer layer 50 fully fills a volume between the molding compound 14 and the electronic devices 20 and 30 to encapsulate the electronic devices 20 and 30 such that the molding compound is not in physical contact with either the depletion-mode III-N device 20 or the enhancement-mode device 30. Portions of the wire-bonds 40-42 extend into the elastomer layer 50 to connect to the device 20 and device 30. The elastomer layer 50 acts as a stress buffer layer between the electronic devices and the molding compound 14 of package 10 to reduce stress on the device from the molding compound 14 and fatigue of the wire-bond connections. For example, the molding compound can exert a compressive stress on the III-N device 20 and the elastomer layer 50 can act to reduce the net compressive stress observed by the III-N device 20. Furthermore, the elastomer layer 50 can have a coefficient of thermal expansion (i.e., CTE) which is greater than the CTE of the molding compound 14, for example at least two times greater. The CTE of the elastomer layer (when measured below the transition temperature) can be for example less than 25 μm/m° C., and the CTE of the molding compound (when measured below the transition temperature) can be for example greater than 75 μm/m° C. Both the molding compound and the elastomer layer can have a transition temperature of 100° C. or greater. The thickness of the elastomer layer between the III-N device and the molding compound should have a minimum thickness of 100 μm or greater. The use of the elastomer layer 50 in the electronic component package increases the thermal cycling robustness of the electronic components and can increase long term reliability.

Figure 4A:
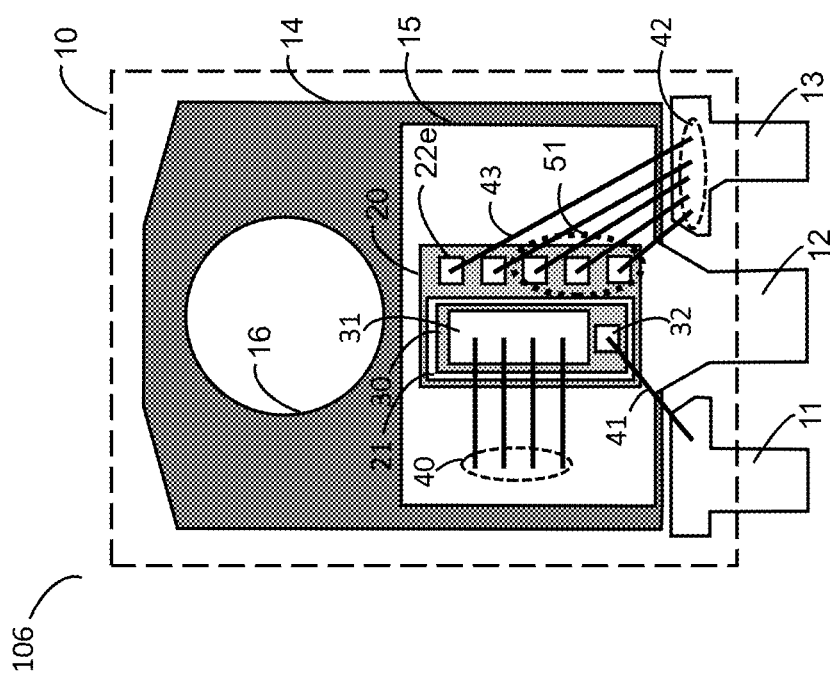
FIGS. 4A and 4B are a plan view and cross-sectional view, respectively, of an electronic component and package.
Figure 4B:
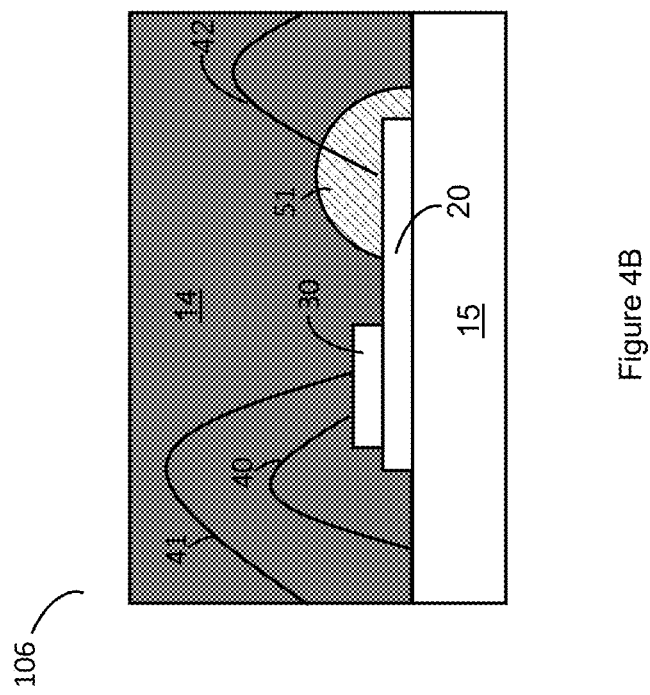

FIGS. 4A and 4B are a plan view and cross-sectional view, respectively, of electronic component 106 which is similar to the electronic component 104. However, the gel elastomer layer 51 (indicated by dashed lines in FIG. 3B) is only partially covering the device 20 between the molding compound 14 and the device 20. For example, as shown in FIG. 4A, the gel elastomer layer covers an area in which the three shortest wire-bonds connect to the three drain pads closest to the third terminal 13, but does not cover, for example drain pad 23, which is the drain pad with the greatest distance from the third terminal 13. It may be desirable to use only a small area of gel to cover the portion of the electronic component device 20 which observe the highest stress level during operation. For example, the area of device 20 which is farthest away from the screw hole 16 may experience the largest thermal expansion during temperature cycling. This can result in a higher stress being at the portion of the device which is closest to the side of the component adjacent the terminals. As such, gel layer 51 may only be needed to reduce the stress on the terminal side of the device opposite the screw hole 16. For example, gel layer 51 can be absent from the drain pad proximal from the screw hole 16 and gel layer 51 can cover the drain pad distal from the screw hole 16. Although not all possible scenarios for partially covering device 20 with silicone gel are shown in FIGS. 4A and 4B, the spirt for which it is intended should remain clear. For example, the silicone gel 51 may cover the drain pad for only the shortest wire-bond, or the two shortest wire-bonds, however if the silicone gel does not cover an area which includes all the wire-bond connections to the drain pads, then the longest wire-bonds should be excluded from the gel area 51.

Figure 5A:
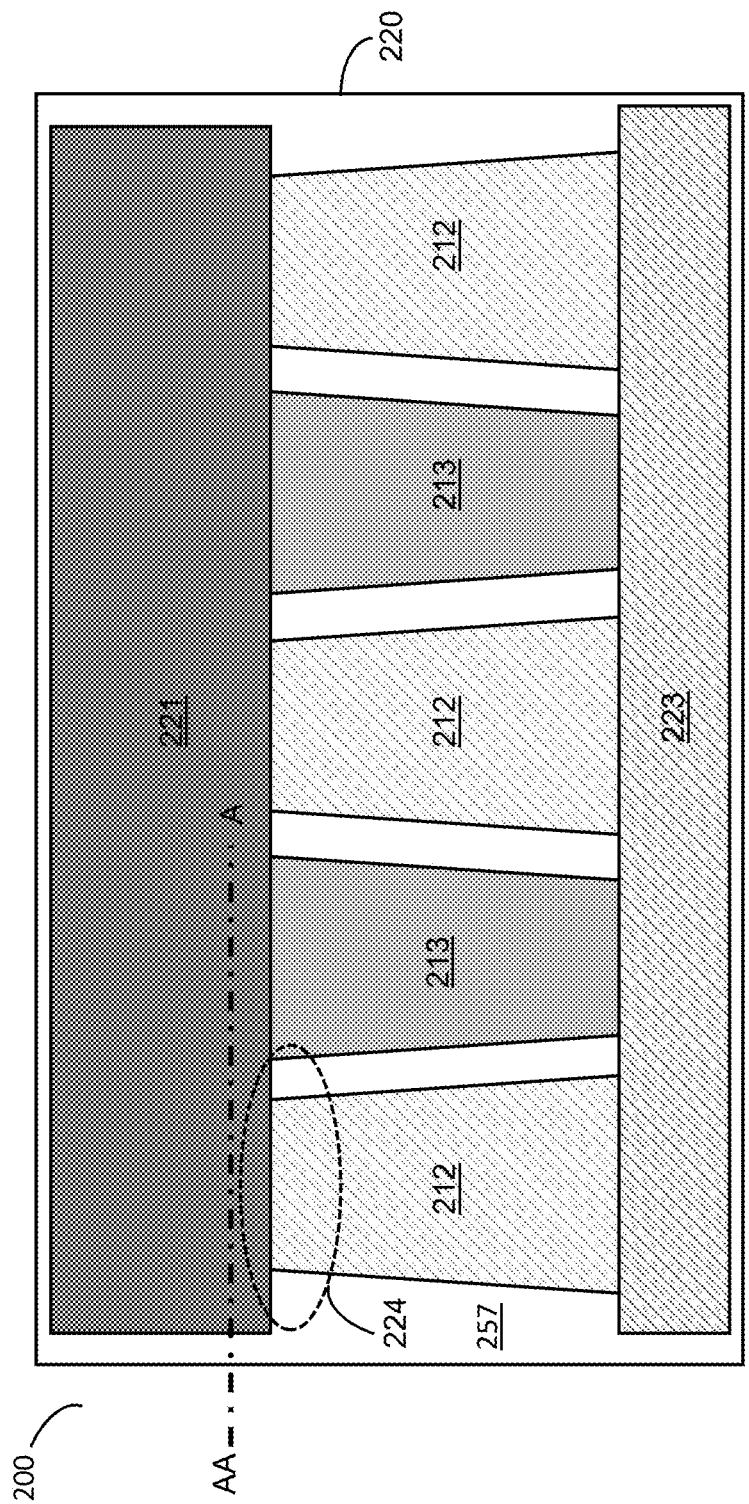
FIG. 5A is a plan view of a III-N device structure.
Figure 5B:
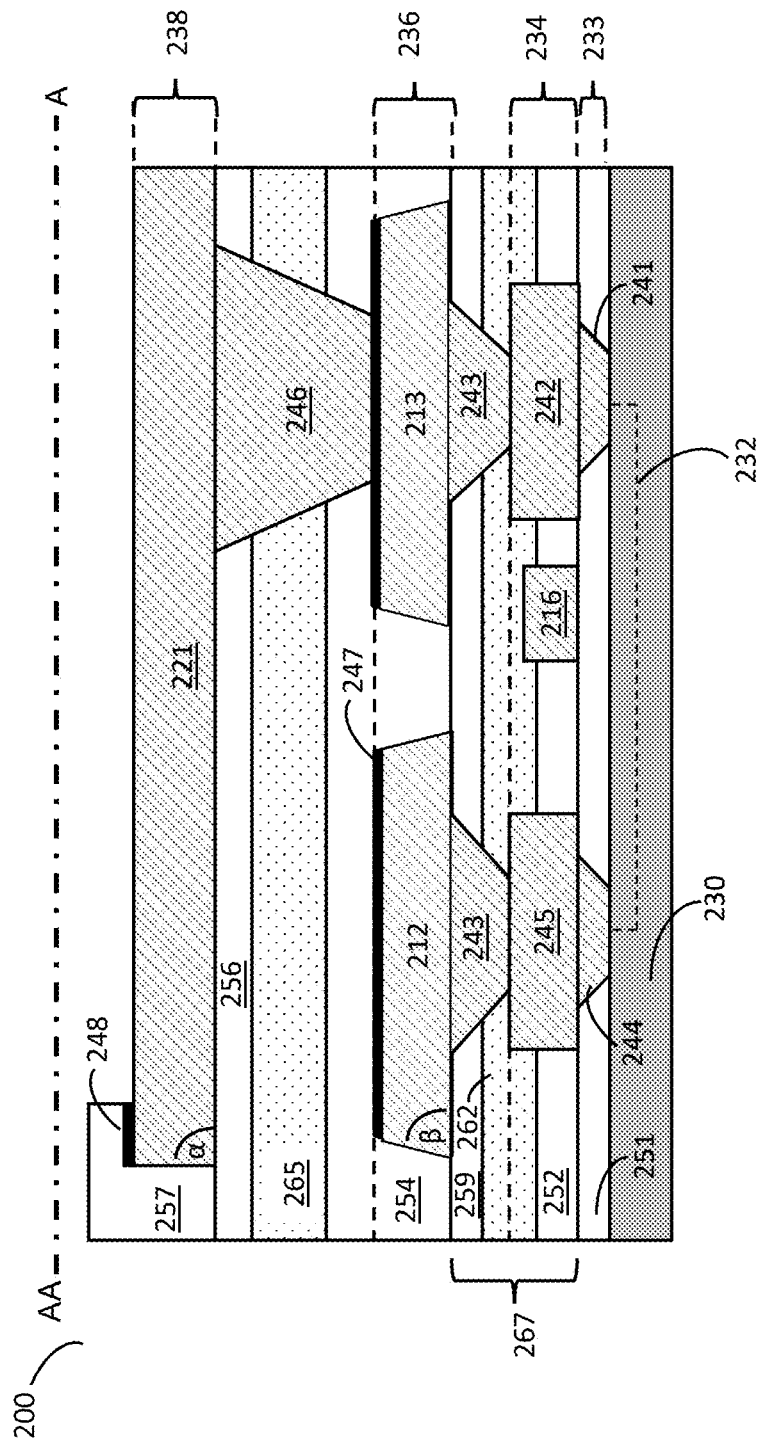
FIGS. 5B and 5C are cross-sectional views of the device of FIG. 5A.

FIG. 5A is a plan view of a III-N device 200 which can be similar to device 20 described in FIG. 1. FIG. 5B is a cross-sectional view of a portion of device 200 taken between the points AA and A as indicated in FIG. 5A. An enhanced detailed region indicated by the dashed area 224 in FIG. 5A is shown in more detail in FIG. 5D. Referring back to FIG. 5B, III-N device 200 uses at least four metal routing layers (M0-M3) and multiple inter-metal dielectric layers (ILDs) to separate the metal routing layers. M0 layer (233) is a contact layer used to make ohmic contact of each device finger to the semiconductor material and is typically less than 0.5 μm thick. The M1 layer (234) is used to increase the conductivity of the ohmic contact layer (244/241) of the device fingers and is typically between 1-4 um thick. The M2 layer (236) is a routing layer to connect all the respective source and drain fingers together and is typically between 3-8 um thick. The M3 layer (238) is used to externally connect the source and drain electrodes to their respective package by providing metal pads for wire-bonds or metal clips and is typically greater than 4 μm thick. The M0-M3 layers are electrically connected together through the use of vias and can be formed of Al, AlCu, AlSi, Cu or another appropriate metal.

The details of device 200 is further described as follows. A semiconductor III-N material structure 230 is formed (commonly from GaN/AlGaN heterostructure) over a substrate (not shown) and a two-dimensional electron gas (2DEG) layer 232 is formed within. An initial metal layer M0 233 is formed (e.g., Ti/Al) to create an ohmic contact with the 2DEG 232 and is electrically connected to the 2DEG. This ohmic contact is shown by drain ohmic contact 244 and source ohmic contact 241 both in contact with the III-N material structure 230. A surface passivation layer (e.g., SiN) is formed over the top surface of the III-N material structure 230. In the case device 200 is a depletion-mode transistor, the surface passivation layer can act as the gate dielectric layer 251 where the gate electrode 216, which is used to modulate the 2DEG channel 232, is formed over the gate dielectric layer 251. An M1 layer 234 is provided (e.g., AlCu) with a first source metal layer 242 connected to source ohmic 241 and a first drain metal layer 245 connected to the drain ohmic 244. An M2 layer 236 is provided (e.g., AlCu) with a second source metal layer 213 and a second drain metal layer 212 connected to the first metal layers 242 and 245, respectively, through vias 243. An M3 layer 238 is provided (e.g., AlCu) with a source pad 221 connected to the second source metal layer 213 through via 246. A drain pad 223 (as shown in FIG. 5A) can connected to the second drain metal layer 212 through a via (not shown).

Still referring to FIG. 5B, inter-metal layer dielectrics (ILDs) 252 and 262 are formed between the M2 metal layers 236 and the III-N material structure 230. ILD layers 252 and 262 can be deposited using a Plasma Enhanced Chemical Vapor Deposition (PECVD) tool. ILD layer 252 and 262 can be the same material (e.g., SiN, SiON, TEOS Oxide) or ILD layer 262 can be formed over layer 252 of a material with a different internal stress. For example, layer 252 can be a PECVD SiN layer and layer 262 can be a PECVD SiON layer or a PECVD TEOS oxide layer. ILD layer 252 can have a negative material stress such that layer 252 is compressive and ILD layer 262 can have a material stress which is less compressive than layer 252 such that layer 262 reduces the total overall stress in the material stack.

Furthermore, inter-layer dielectrics (ILDs) 254, 265 and 256 are formed between the M3 metal layer 238 and the M2 metal layer 236. ILD layer 254 can be a SiN layer (e.g., PECVD SiN) and ILD layer 262 can be formed over layer 254 of a material with a different internal stress (e.g., SiON, TEOS Oxide). For example, layer 254 can be a PECVD SiN layer and layer 265 can be a PECVD SiON layer or a PECVD TEOS oxide layer. ILD layer 254 can have a negative material stress such that layer 254 is compressive and ILD layer 265 can have a material stress that is less compressive such that layer 265 reduces the total overall stress in the material stack.

A thin highly compressive stress layer 256 (e.g., SiN, SiON, or TEOS oxide) can be formed over layer 265. The high stress layer 256 can prevent inter-dielectric cracking and improve the thermal cycling performance of the device and structurally increase the dielectric layer system robustness. For example, ILD layer 265 can be SiON layer and high stress layer 256 can be SiON with a higher stress than layer 265. Or ILD layer 265 can be a TEOS oxide layer and high stress layer 256 can be a TEOS oxide layer with a higher stress than layer 265. The internal compressive stress of layer 256 can be 2 times greater, or 10 times greater, or 100 times greater the internal compressive stress of layer 265. ILD layer 265 can be greater than 3 μm thick and high stress layer 256 can be less than 3 um thick. For example, ILD layer 265 can be ~4 μm thick and high stress layer 256 can have a thickness between 0.01-0.5 μm thick.

Optionally, ILD layer 259 formed over ILD layer 262 between the first metal layer and the semiconductor material. ILD layer 259 can have similar properties as those describe in layer 256. In a particular embodiment, a material stack 267 has at least a first metal routing layer 234 and a second metal routing layer 236. The material stack 267 further includes a first dielectric layer 252 a second dielectric layer 262 over the first dielectric layer 252 and a third dielectric layer 259 over the second dielectric layer 262, where both the first, second and third layers are formed between the III-N material layer 230 and the second metal routing layer 236, where the third dielectric layer 259 has a thickness of ¼ or less the thickness of the second dielectric layer 262 and an internal compressive stress of the first 252 and third dielectric layers 252 and 259 respectively, are at least 2 times greater than the internal compressive stress of the second dielectric layer 262. An encapsulation layer 257 (e.g., SiN or Polyimide or both) can be formed over the ILD 265/256 and partially over the M3 layer 238 to hermetically seal and encapsulate the device 200.

Figure 5C:
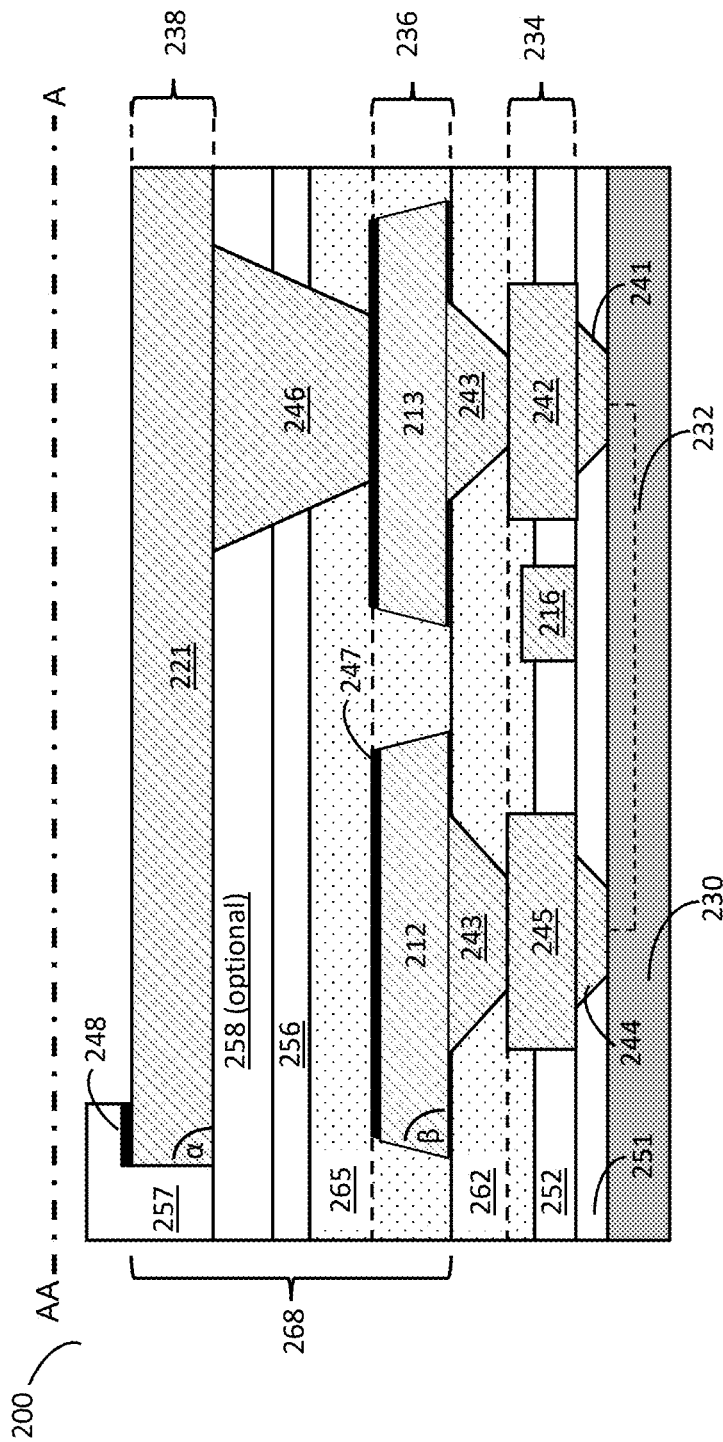

FIG. 5C is a cross-sectional view of a similar embodiment shown in FIG. 5B, however FIG. 5C omits the ILD layer 254 shown in FIG. 5B. Here, ILD layer 265 can be SiON and high stress layer 256 can be SiON with a higher stress than layer 265. Or ILD layer 265 can be a TEOS oxide layer and high stress layer 256 can be a TEOS oxide layer with a higher stress than layer 265. The compressive stress of layer 256 can be 2 times greater, or 10 times greater, or 100 times greater the compressive stress of layer 265. ILD layer 265 can be greater than 2 μm thick and high stress layer 256 can be less than 1 μm thick. For example, ILD layer 265 can be ~4 μm thick and high stress layer 256 can be ~0.5 μm thick.

In a particular embodiment, a material stack 268 has at least a first metal routing layer 236 and a second metal routing layer 238. The material stack 268 further includes a first dielectric layer 265 and a second dielectric layer 256 over the first dielectric layer, where both the first and second layers are formed between the first metal routing layer 236 and the second metal routing layer 238, where the second dielectric layer 256 has a thickness of ¼ or less the thickness of the first dielectric layer 265 and an internal compressive stress of the second dielectric layer 256 is at least 2 times greater, or at least 10 times greater than the internal compressive stress of the first dielectric layer 265. Furthermore, FIG. 5C depicts an optional polyimide layer 258 which is formed over the first and second layers 265 and 256. Polyimide layer 258 can be greater than 2 μm thick. Polyimide layer 258 can further act to reduce the stress between M3 layer 238 and the underlaying ILD layers (265/256). In addition, polyimide layer 258 can act as an additional insulating layer over layer 256 to prevent electrical leakage currents between the drain connected M2 layer 212 and source connected M3 layer 221 if there are material defects or cracking present in ILD layers 265/256.

An ILD planarization can be implemented after deposition of the ILD layers 252/262 to supply a flat dielectric surface to deposit subsequent layers in order to reduce the occurrence of ILD defects. One method of planarization is to deposit ILD layer 262, apply a photoresist, then use a non-selective isotropic etch of the photoresist and ILD layer 262 partially leaving a flat surface. The deposition method of 262 can be made such that the etch rate of 262 and the photoresist layer are similar to achieve the desired planarization effect. After etching, a subsequent optional dielectric layer (not shown) can be deposited before M2 layer 236 deposition. Alternately, a chemical-mechanical polishing (i.e., CMP) step can be implemented after deposition of 262 to achieve the desired planar surface. These same planarization methods can also be implemented after ILD layer 254 or layer 265 to improve the planar surface for M3 layer 238 deposition.

As shown in FIG. 5B an Anti-Reflective Coating layer (i.e., ARC layer) 247 can be formed on the top surface of M2 layer 236 (e.g., Si or TiN) and an ARC layer 248 can be formed on the top of M3 layer 238. The ARC layers 247 and 248 can reduce notching in the photoresist (PR) patterning used to define the outline of the metal layers. This PR notching can be caused by light reflecting back from the topography of the M2 or M3 layers during photo exposure and create a poor resist patterning profile. ARC layers 247 and/or 248 can reduce the notching. Subsequently, if the notching is etched into, for example M2 236, ILD layers 245 and 265 can form weak spots or cracks and reduce device reliability.

As seen in FIG. 5B, M2 layer 236 has a sidewall angle β and M3 238 has a sidewall angle α where β<α. Sidewall angle β can be less than angle α by the use of a photoresist reflow process before the metal etching of M2 layer 236. For example, angle β can be less than 60° and angle α can be greater than 80°. Forming angle β less than 60° can reduce surface topology and help increase planarization. This allows for a high-quality coverage of ILD layers 245 and 265 reducing the risk of ILD cracks and increasing device reliability.

Figure 5D:
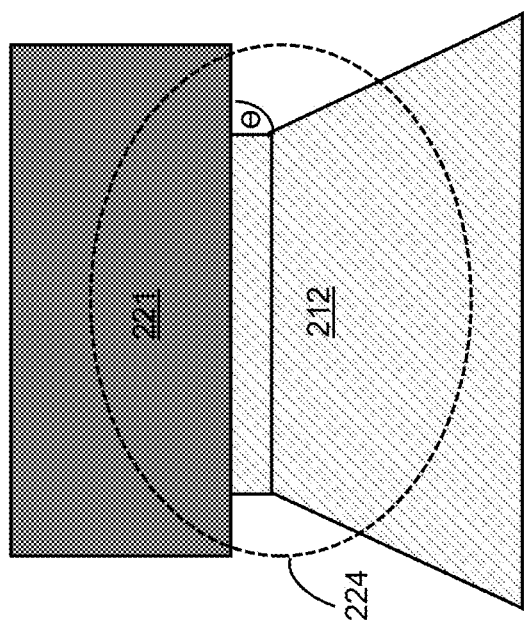
FIG. 5D is an enhanced detailed plan view of the device of FIG. 5A.

Referring back to FIG. 5A, device 200 includes a source pad 221 formed from the M3 metal routing layer 238 and a drain pad 223 formed from the M3 metal routing layer 238. Device 200 includes second drain metal layers 212 electrically connected to drain pad 223 through vias and second source metal layers 213 electrically connected to source pad 221 through vias. Layers 212 and 213 are both formed from the M2 metal routing layer 236 which runs below the M3 layer 238. Drain connected layer 212 crosses below source pad 221 in dashed region 224 which is shown in enhanced detail in FIG. 5D. As seen in FIG. 5D, angle θ shows the angle at which drain connected layer 212 intersects source pad 221. This angle θ should be approximately ~90° in order to ensure a quality interface between the drain connected layer 212 and the source connected layer 221 and to maintain the quality of the ILD layers between 212 and 221.

Figure 6:
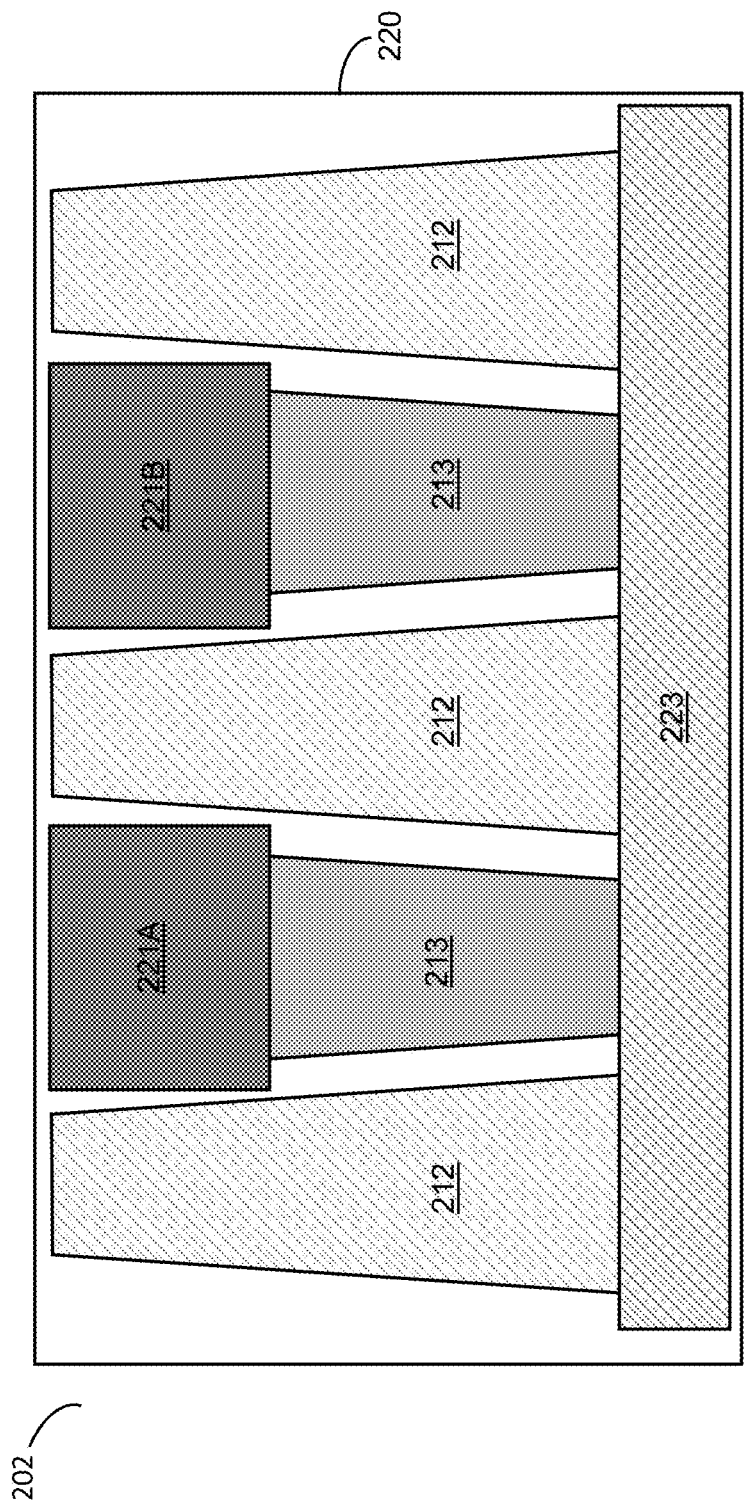
FIG. 6 is a plan views of a III-N device structure.

Device 202 in FIG. 6 shows another embodiment where the M3 metal layer source pad 221 is separated into pads 221A and 221B such that the low-voltage source pads? do not extend over the high-voltage second drain metal layer 212 and are only formed over low-voltage second source layers 213. This configuration can improve device reliability by eliminating any ILD layer defects which may be present which can reduce reliability when forming high voltage drain connected M2 layers under and low voltage source connected M3 layers. This configuration also prevents the low voltage M3 layer (221A) from crossing the high voltage M2 layer (212), thus reducing the occurrence of device leakage through ILD layers. Although device 202 in FIG. 6 shows two source pads (221A/221B), any number of source pads may be present in the device such as designed to achieve the current carrying requirements of the device. For example, the number of source pads used may be great enough to at least cover the area required to attach the enhancement-mode transistor 30 shown in FIG. 1.

A number of implementations have been described. Nevertheless, it will be understood that various modifications may be made without departing from the spirit and scope of the techniques and devices described herein.

What is claimed is:

1. An electronic component, comprising:
   a first terminal, a second terminal, and a third terminal extending from a component package; and
   a depletion-mode III-N transistor, and an enhancement-mode transistor arranged in the package; wherein
   a first gate electrode of the enhancement-mode transistor is electrically connected to the first terminal, a first source electrode of the enhancement-mode transistor and a second gate electrode of the depletion-mode III-N transistor are electrically connected to the second terminal, a first drain electrode of the enhancement-mode transistor is electrically connected to a second source electrode of the depletion-mode III-N transistor, and a second drain electrode of the depletion-mode III-N transistor is electrically connected to the third terminal; and the second drain electrode comprises multiple drain pads each sequentially a further distance from the third terminal, wherein a wire-bond extends from each drain pad to the third terminal, each wire-bond comprising a length; wherein a diameter of a longest wire-bond is greater than a diameter of a shortest wire-bond.

2. The component of claim 1, wherein the diameter of the longest wire-bond is 10 mil or greater, and the diameter of the shortest wire-bond is less than 10 mil.

3. The component of claim 1, wherein the diameter of each wire-bond increases monotonically from the wire-bond of the shortest length to the wire-bond of the longest length.

4. The component of claim 1, further comprising a conductive structural package base, wherein a substrate of the depletion-mode III-N transistor is electrically connected to a second gate electrode of the III-N transistor and the substrate is electrically connected to the conductive structural package base.

5. The component of claim 4, wherein the conductive structural package base is electrically connected to the second terminal.

6. An electronic component, comprising:
at least a first terminal extending from a component package; and
a III-N transistor arranged in the package; wherein
a drain electrode of the III-N transistor is electrically connected to the first terminal; and
the drain electrode comprising multiple drain pads each sequentially a further distance from the first terminal, wherein a wire-bond extends from each drain pad to the first terminal, each wire-bond comprising a length and a diameter; wherein
a diameter of a longest wire-bond is greater than a diameter of a shortest wire-bond.

7. The component of claim 6, wherein the III-N transistor is an enhancement-mode transistor or a depletion-mode transistor.

8. The component of claim 6, wherein the diameter of the longest wire-bond is 10 mil or greater, and the diameter of the shortest wire-bond is less than 10 mil.

9. The component of claim 6, wherein the diameter of each wire-bond increases monotonically from the wire-bond of the shortest length to the wire-bond of the longest length.

* * * * *